United States Patent
Wu et al.

(10) Patent No.: US 8,407,268 B2
(45) Date of Patent: Mar. 26, 2013

(54) METHOD FOR DETERMINING AN OPTIMUM SAMPLING FREQUENCY, AND A POWER ANALYZER PERFORMING THE METHOD

(75) Inventors: Rong-Ching Wu, Dashu Township (TW); Ching-Tai Chiang, Dashu Township (TW); Jong-Ian Tsai, Dashu Township (TW)

(73) Assignee: I Shou University, Dashu Township (TW)

( * ) Notice: Subject to any disclaimer, the term of this patent is extended or adjusted under 35 U.S.C. 154(b) by 1068 days.

(21) Appl. No.: 12/369,974

(22) Filed: Feb. 12, 2009

(65) Prior Publication Data

US 2009/0307293 A1    Dec. 10, 2009

(30) Foreign Application Priority Data

Jun. 6, 2008   (TW) ............................... 97121321 A (51) Int. Cl.
   *G06F 19/00*   (2006.01)
   *G01R 23/16*   (2006.01)

(52) U.S. Cl. .......... 708/207; 708/208; 708/209; 702/77; 702/199

(58) Field of Classification Search .......... 708/207–209; 702/77, 199
   See application file for complete search history.

(56) References Cited

U.S. PATENT DOCUMENTS

| | | | |
|---|---|---|---|
| 5,365,468 A * | 11/1994 | Kakubo et al. | 708/313 |
| 6,094,444 A * | 7/2000 | Auer | 370/535 |
| 6,335,615 B1 * | 1/2002 | Gorin | 324/76.39 |
| 6,915,224 B2 * | 7/2005 | Wu | 702/77 |
| 7,035,400 B1 * | 4/2006 | Gaikwad et al. | 379/417 |
| 7,428,270 B1 * | 9/2008 | Dubuc et al. | 375/316 |
| 2009/0187363 A1 * | 7/2009 | Wu et al. | 702/77 |
| 2010/0195704 A1 * | 8/2010 | Cendrillon et al. | 375/220 |

\* cited by examiner

*Primary Examiner* — Tammara Peyton
(74) *Attorney, Agent, or Firm* — Lowe, Hauptman, Ham & Berner, LLP (57) ABSTRACT

A method for determining an optimum sampling frequency to be performed by a power analyzer includes the following computer-implemented steps: sampling a time domain signal to obtain a sampling signal according to a predetermined sampling frequency; obtaining two reference sampling signals using higher and lower sampling frequencies compared to the predetermined sampling frequency; transforming the sampling signal and the reference sampling signals to frequency domain signals; computing a sum-of-amplitudes for each of the three frequency domain signals; estimating a minimum sum-of-amplitudes value and a corresponding re-sampling frequency; obtaining a new reference sampling signal using the re-sampling frequency; transforming the new reference sampling signal to a frequency domain signal, and computing a sum-of-amplitudes therefor; and re-estimating the minimum sum-of-amplitudes value and the corresponding re-sampling frequency. The re-sampling frequency that conforms with a predetermined convergence standard is the optimum sampling frequency.

6 Claims, 5 Drawing Sheets

METHOD FOR DETERMINING AN OPTIMUM SAMPLING FREQUENCY, AND A POWER ANALYZER PERFORMING THE METHOD

CROSS-REFERENCE TO RELATED APPLICATION

This application claims priority of Taiwanese Application No. 097121321, filed on Jun. 6, 2008.

BACKGROUND OF THE INVENTION

1. Field of the Invention

The present invention relates to a method for determining an optimum sampling frequency to be performed by a power analyzer, more particularly to a method for determining an optimum sampling frequency for a power analyzer by referring to a V-curve plot.

2. Description of the Related Art

In the field of measurement of an electrical power system, important digital signal processing operations include measurement of a magnetic field, measurement of a non-linear load, measurement of harmonics, etc. The measurement of harmonics can be applied in analyses of amplitudes, phases, real power, reactive power, apparent power, equivalent impedance and total harmonic distortion. Various commercial harmonic measuring devices are in the market heretofore for different purposes, such as:

a spectrum analyzer for analysis of harmonic components;

a harmonic analyzer for analysis of amplitudes of harmonics;

a distortion analyzer for analysis of total harmonic distortion; and digital harmonic measuring equipments using a digital wave filter and Fast Fourier Transform (FFT) for rapid acquisition of a measuring signal on large scale, and cooperating with a personal computer real time analysis of the signal.

Discrete Fourier Transform (DFT) can be used to transform a time domain signal to a frequency domain signal to obtain a frequency spectrum. In the frequency spectrum, components of different frequencies are separated, and the frequency domain signal is a combination of a plurality of independent components. The frequency spectrum can show important information that cannot be acquired via the time domain signal, and therefore a complex system can be processed and parameters of the time domain signal can be obtained via the frequency spectrum. With the development of FFT, it takes a relatively short time to transform a time domain signal to a frequency domain signal. Therefore, FFT is most commonly used in analyses of harmonics.

However, FFT has limits in actual applications, and a digital signal is sampled randomly, so an error will occur due to limitations of FFT. The most common effects are a picket-fence effect and a leakage effect attributed to a sampling frequency that is not an integral multiple of a frequency of an original signal.

The aforementioned picket-fence effect is attributed to harmonic frequencies that do not match with graduations of the frequency spectrum. On a premise of an accurate analysis, characteristics of the time domain signal cannot be changed to conform with the graduations of the frequency spectrum. A sole method available for enabling an accurate analysis is to shift the graduations of the frequency spectrum to conform with the characteristics of the time domain signal. A shift in the graduations of the frequency spectrum can be achieved by changing the sampling frequency or a number of sample points. Commonly, the number of sample points is 128 and the sampling frequency is 128*60 (data/sec) for obtaining a sampling signal of a system with a frequency of 60 Hz. There are two problems when changing the number of sample points for shifting the graduations of the frequency spectrum. First, when the number of sample points is not $2^r$ (wherein r is a positive integer), FFT cannot be used, and only DFT can be used for transforming the sampling signal of the system to the frequency domain signal. Therefore, it takes a relatively long time for computing. Second, on the aforementioned conditions of the sampling signal, an increase/decrease of one in the number of sample points causes an approximate decrease/increase of 0.5 Hz in the graduations of the frequency spectrum correspondingly. This quantity is much greater than a variation of frequencies of an electrical power system in normal operation. Therefore, it is more practical to change the sampling frequency for shifting the graduations of the frequency spectrum.

There are two problems when changing the sampling frequency and re-sampling the original signal. If the original signal is not one stored in a digital system, it will be needed to ensure that characteristics of a re-sampling signal conform with those of the previous sampling signal when re-sampling. It is difficult to achieve this condition. If the original signal is one stored in a digital system, data of the digital signal will be discrete. When re-sampling discrete data, it is needed to use a numerical method to acquire new data. This method will cause an error, but can ensure that the characteristics of the re-sampling signal conform with those of the previous sampling signal when re-sampling. The present invention utilizes Lagrange's interpolation method to solve the problem attributed to re-sampling discrete data.

SUMMARY OF THE INVENTION

Therefore, an object of the present invention is to provide a method for determining an optimum sampling frequency to be performed by a power analyzer by referring to a V-curve plot that shows a relationship between a sum-of-amplitudes and a sampling frequency. Graduations of a frequency spectrum can conform with parameters of a signal by this method according to the present invention so as to reduce a picket-fence effect and a leakage effect. Moreover, the frequency spectrum shows accurate parameters of harmonics so as to enhance accuracy of the frequency spectrum.

Accordingly, a method for determining an optimum sampling frequency to be performed by a power analyzer according to the present invention comprises the following computer-implemented steps:

a) sampling a continuous time domain signal to obtain a sampling signal according to a predetermined sampling frequency and a predetermined number of sample points;

b) obtaining two reference sampling signals based upon the sampling signal obtained in step a), wherein one of the reference sampling signals is obtained using a higher sampling frequency that is higher than the predetermined sampling frequency in step a), and the other one of the two reference sampling signals is obtained using a lower sampling frequency that is lower than the predetermined sampling frequency in step a);

c) transforming the sampling signal obtained in step a) and the reference sampling signals obtained in step b) to frequency domain signals using Fast Fourier Transform, respectively;

d) computing a sum-of-amplitudes for each of the three frequency domain signals obtained in step c);

e) estimating a minimum sum-of-amplitudes value and a corresponding re-sampling frequency based upon the three sums-of-amplitudes computed in step d) and the corresponding sampling frequencies used in steps a) and b);

f) obtaining a new reference sampling signal based upon the sampling signal obtained in step a) using the re-sampling frequency;

g) transforming the new reference sampling signal obtained in step f) to a frequency domain signal using Fast Fourier Transform;

h) computing a sum-of-amplitudes for the frequency domain signal obtained in step g);

i) re-estimating the minimum sum-of-amplitudes value and the corresponding re-sampling frequency with the sum-of-amplitudes obtained in step h) being used to replace one of the three sums-of-amplitudes that was used to estimate the previous minimum sum-of-amplitudes value and that has a largest variance with the sum-of-amplitudes obtained in step h), and with the re-sampling frequency used in step f) being used to replace one of the three sampling frequencies that was used to estimate the previous minimum sum-of-amplitudes value and that corresponds to the one of the three sums-of-amplitudes with the largest variance; and j) repeating steps f) to i) until respective changes in the re-estimated minimum sum-of-amplitudes value and the corresponding re-sampling frequency conform with a predetermined convergence standard;

wherein the re-sampling frequency that conforms with the predetermined convergence standard is the optimum sampling frequency.

Another object of the present invention is to provide a power analyzer adapted for determining an optimum sampling frequency.

Accordingly, a power analyzer comprises an analog/digital converter adapted for sampling a continuous time domain signal to obtain a digital sampling signal, a processor coupled to the analog/digital converter and adapted for performing the steps of the method for determining an optimum sampling frequency of this invention, and a display unit coupled to and controlled by the processor for outputting an optimum frequency spectrum based upon the optimum sampling frequency obtained by the processor.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

In this embodiment, it is assumed that a power signal has the following characteristics: (1) aperiodic signal; (2) an integral number of harmonics; and (3) gradual decrease in high-order harmonics. Because the power signal is periodic, a frequency spectrum thereof has a characteristic of discontinuous components. That is, when energy is concentrated on a same graduation of the frequency spectrum, the frequency spectrum is an optimum frequency spectrum. Because the high-order harmonics decrease gradually, there is a relatively smaller distortion when re-sampling the power signal. Because the number of harmonics is an integer, the optimum frequency spectrum can be obtained by changing a sampling frequency. First of all, conditions for the optimum frequency spectrum are discussed herein. If a harmonic signal is composed of a sinusoidal wave component, a sampling signal can be represented by $$x(n) = A_1 \cos(2\pi f_1 n/N + \phi_1), \quad (1),$$

wherein N is a number of sample points and is equal to $2^r$ (r is a positive integer), n ranges from 0 to N−1, $A_1$ is an amplitude of the sinusoidal wave component, $\phi_1$ is a phase of the sinusoidal wave component, and $f_1$ is a frequency of the sinusoidal wave component. According to a frequency spectrum based upon a frequency domain signal transformed from the sampling signal, a relationship between a largest amplitude $A_p$ and the sampling signal can be represented by $$A_p = \frac{NA_1}{2} \frac{\sin \pi \delta}{\pi \delta}, \quad (2)$$

wherein δ is a bias in the frequency attributed to a leakage effect, i.e., energy leaks to adjacent graduations of the frequency spectrum. It is assumed that an amplitude on a graduation with a distance m' from another graduation corresponding to the largest amplitude $A_p$ in the frequency spectrum is $A_{p+m'}$. Thus, a relationship between the amplitude $A_{p+m'}$ and the largest amplitude $A_p$ can be represented by $$\frac{A_{p+m'}}{A_p} = \frac{\delta}{\delta + m'}. \quad (3)$$

According to Cauchy-Schwarz Inequality, $$\left(\sum_{m=0}^{N-1} A(m)\right)^2 \geq \sum_{m=0}^{N-1} A^2(m), \quad (4)$$

for a signal composed of a sinusoidal wave component, the right side of Equation 4 is energy of the signal, i.e., $$\Sigma A^2(m) = A_1^2. \quad (5)$$

$A_1^2$ in Equation 5 is a constant, and thus a minimum value of the left side of Equation 4 can be obtained. Because a characteristic of a periodic signal is concentration, it is assumed that energy of harmonics is concentrated on the graduations of the frequency spectrum from p−g to p+g. Therefore, a sum-of-amplitudes can be represented by $$AS = \sum_{m=0}^{N-1} A(m) = \frac{NA_1}{2\pi} \sum_{m'=-g}^{g} \frac{\sin\delta}{\delta + m'}. \quad (6)$$

From Equation 6, it can be known that a minimum value of the sum-of-amplitudes AS occurs when δ is zero.

Figure 1:
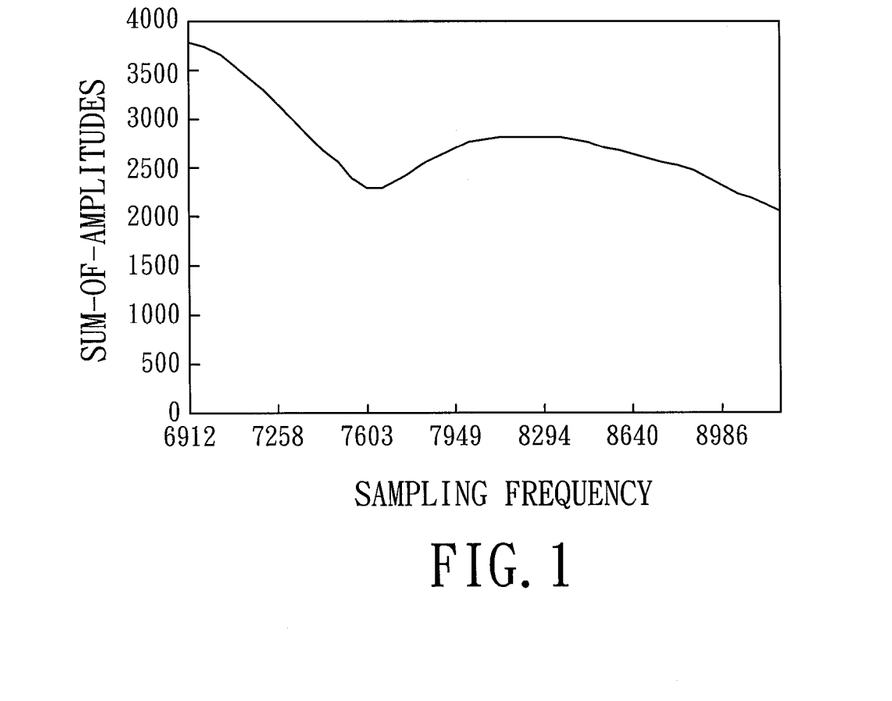
FIG. 1 is a V-curve plot showing an exemplary relationship between a sum-of-amplitudes and a sampling frequency to illustrate a preferred embodiment of a method for determining an optimum sampling frequency for a power analyzer according to the present invention.

There is another factor that will affect the sum-of-amplitudes AS, i.e., Parserval's Theorem. When changing the sampling frequency for estimating a minimum sum-of-amplitudes value in this embodiment according to the present invention, a scope of the frequency spectrum varies due to a change of the sampling signal. Therefore, an optimum sampling frequency for the optimum frequency spectrum corresponds to a regional minimum sum-of-amplitudes value, but not a universal minimum sum-of-amplitudes value. As shown in FIG. 1, it can be noted that the sum-of-amplitudes AS decreases with an increase in the sampling frequency. This tendency is attributed to Parserval's Theorem. Moreover, from the curve of FIG. 1, it can be noted that the regional minimum sum-of-amplitudes value occurs when the sampling frequency is 7603.2, i.e., the optimum sampling frequency.

Figure 2:
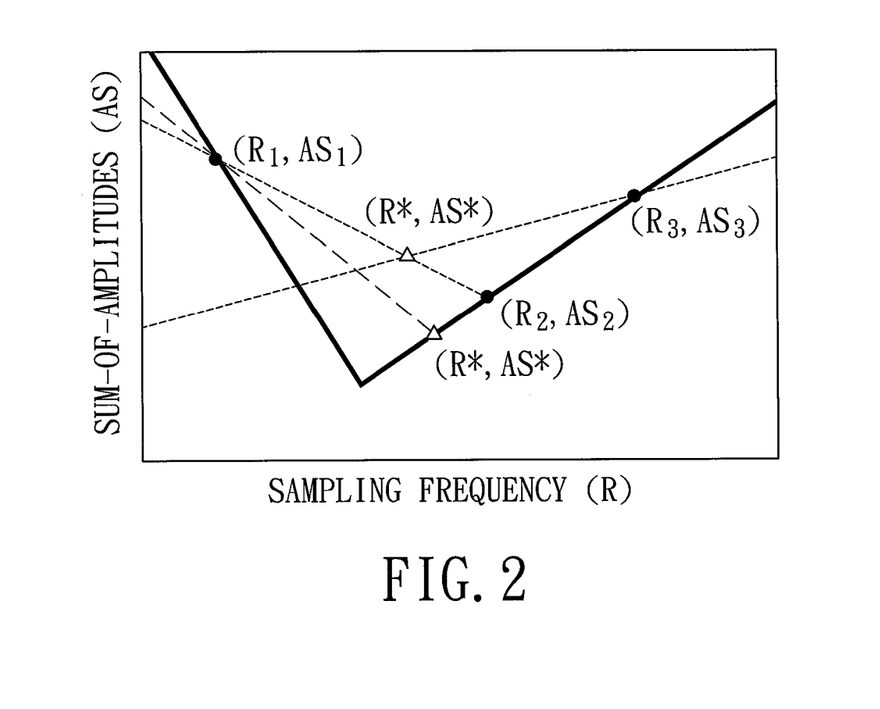
FIG. 2 is a schematic plot illustrating a step for estimating a minimum sum-of-amplitudes value and a corresponding re-sampling frequency of the preferred embodiment according to the present invention.

As shown in FIG. 1, a relationship between the sum-of-amplitudes AS and the sampling frequency R tends to exhibit a V-curve. Estimating the optimum sampling frequency is to find a lowest point (R*, AS*) in this V-curve. The lowest point (R*, AS*) in the V-curve can be estimated based upon three given points. As shown in FIG. 2, it is assumed that values of three points $(R_1, AS_1)$, $(R_2, AS_2)$ and $(R_3, AS_3)$ are given. It is also assumed that slopes of two sides of the V-curve are additive inverses of each other, and the following equation sets can be obtained based upon the slopes.

$$(AS^*-AS_2)(R_2-R_1)=(AS_2-AS_1)(R^*-R_2) \quad (7)$$

$$(AS_2-AS_1)(R^*-R_3)=-(AS^*-AS_3)(R_2-R_1) \quad (8)$$

and $$(AS^*-AS_2)(R_2-R_3)=(AS_2-AS_3)(R^*-R_2) \quad (9)$$

$$(AS_2-AS_3)(R^*-R_1)=-(AS^*-AS_1)(R_2-R_3) \quad (10)$$

Based upon Equation set 7 and 8, or Equation set 9 and 10, the possible lowest point (R*, AS*) in the V-curve is $$R^* = \frac{R_2 + R_1}{2} + \frac{(R_2 - R_3)(AS_1 - AS_2)}{2(AS_2 - AS_3)} \quad (11)$$

$$AS^* = \frac{AS_2 + AS_1}{2} + \frac{(AS_2 - AS_3)(R_1 - R_2)}{2(R_2 - R_3)}, \quad (12)$$

or $$R^* = \frac{R_2 + R_1}{2} + \frac{(R_2 - R_1)(AS_3 - AS_2)}{2(AS_2 - AS_1)} \quad (13)$$

$$AS^* = \frac{AS_2 + AS_3}{2} + \frac{(AS_2 - AS_1)(R_3 - R_2)}{2(R_2 - R_1)}. \quad (14)$$

Wherein a smaller one of AS* computed by Equations 12 and 14 is the minimum sum-of-amplitudes value, and a corresponding re-sampling frequency R* computed by Equation 11 or 13 is the optimum sampling frequency.

However, the relationship between the sum-of-amplitudes AS and the sampling frequency R is not actually represented by a completely symmetrical V-curve. Therefore, iteration of Equations 11 to 14 is needed to acquire a more preferable solution. The re-sampling frequency R* computed by Equation 11 or 13 is used to compute a corresponding sum-of-amplitudes. Then, a new point of this sum-of-amplitudes and the re-sampling frequency R* is used to replace one of the three points that was used to estimate the previous minimum sum-of-amplitudes value and that has a largest variance with this new point in the iteration of this embodiment according to the present invention.

In this embodiment, an l degree polynomial of Lagrange's Interpolation Method is used to solve a problem attributed to re-sampling. When a scale of the reference sampling signal is n', a sample point of the reference sampling signal can be obtained based upon l+1 sample points of the sampling signal x(n) that are most adjacent to the $n^{th}$ sample point thereof, i.e., $x(n_0)$, $x(n_1)$, $x(n_2)$, ..., $x(n_l)$. The reference sampling signal x(n') can be represented by $$x(n') = \sum_{i=0}^{l} \left( \prod_{\substack{j=0 \\ j \neq i}}^{l} \frac{n' - n_j}{n_i - n_j} \right) x(n_i). \quad (15)$$

Equation 15 is an l degree Lagrange's interpolation polynomial, wherein $n_i$ and $n_j$ are graduations corresponding to $x(n_i)$ and $x(n_j)$, respectively. When l is equal to 2, three most-adjacent sample points of the sampling signal x(n) are taken as reference; when l is equal to 4, five most-adjacent sample points of the sampling signal x(n) are taken as reference; and so on. Therefore, the problem attributed to re-sampling can be resolved.

Figure 3:
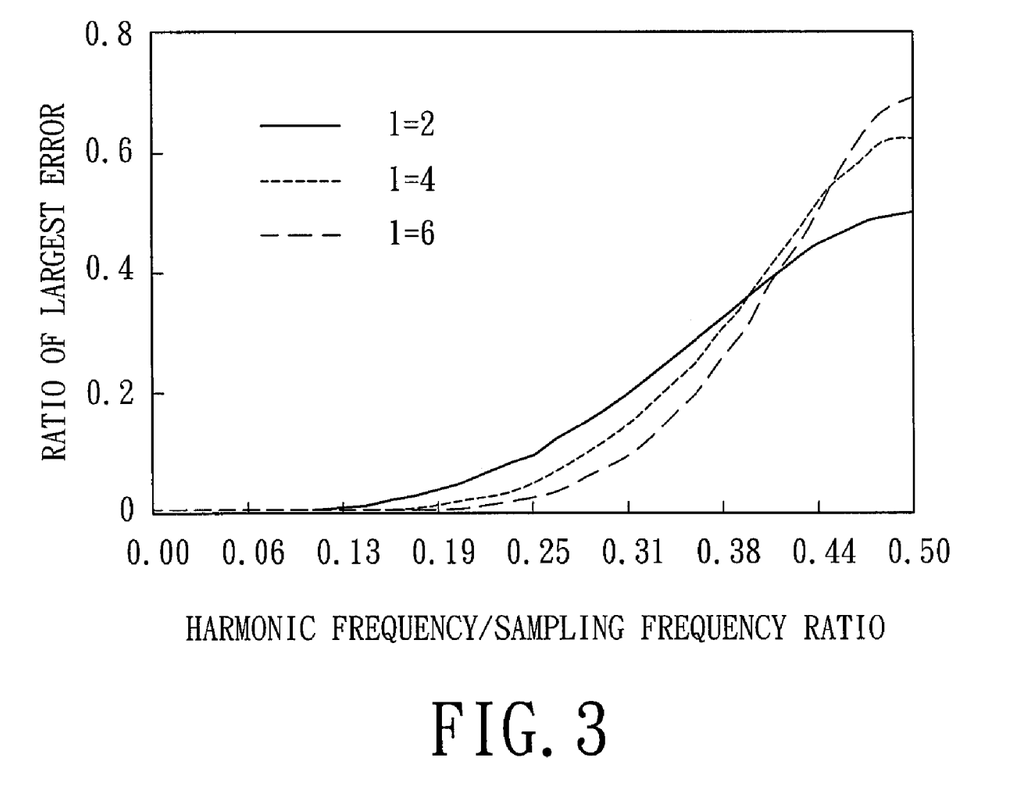
FIG. 3 is a plot showing ratios of largest errors attributed to re-sampling with different re-sampling frequencies of the preferred embodiment according to the present invention.

If a signal is composed of different periodic functions, a sampling signal can desirably represent characteristics of the signal when re-sampling the signal at relatively smoother waveforms. The relatively smoother waveforms are composed of components at low frequencies, and therefore a reference sampling signal is relatively accurate when re-sampling the components of the signal at relatively lower frequencies. Comparatively, relatively sharper waveforms contain components at high frequencies, and therefore a reference sampling signal has relatively larger errors and distortion when re-sampling the components of the signal at relatively higher frequencies. This phenomenon is illustrated in FIG. 3. When a harmonic frequency is lower than ¼ of the sampling frequency, a result of re-sampling is accurate. In this embodiment, the sampling frequency is more than four times the highest frequency of the power signal for maintaining accuracy when re-sampling.

Figure 4:
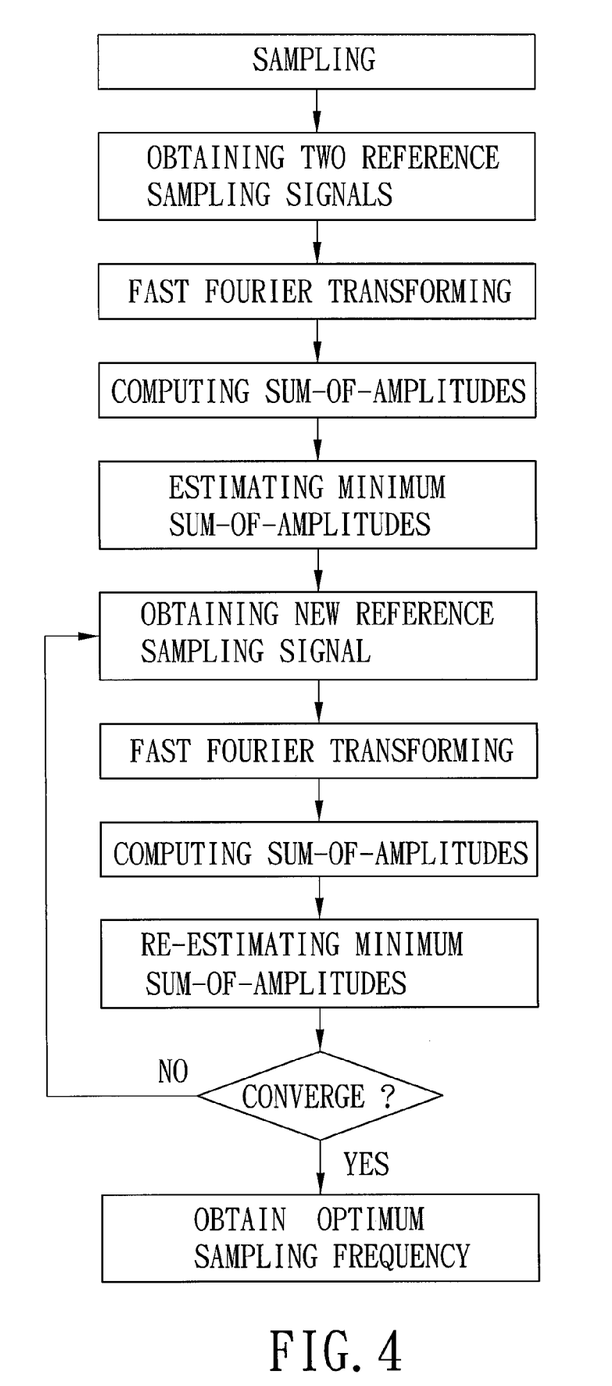
FIG. 4 is a flow chart illustrating the preferred embodiment of a method for determining an optimum sampling frequency for a power analyzer according to the present invention.
Figure 5:
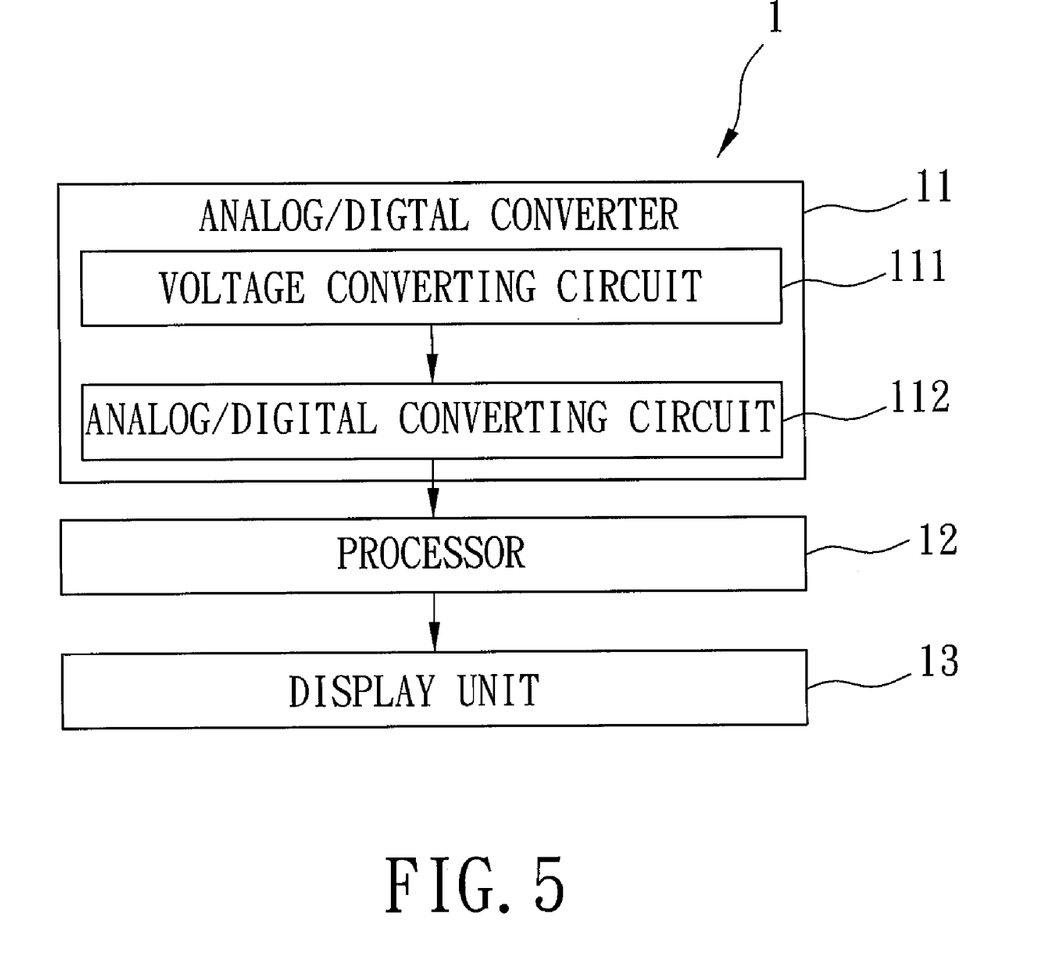
FIG. 5 is a schematic block diagram illustrating the preferred embodiment of a power analyzer adapted for determining an optimum sampling frequency according to the present invention.

Referring to FIG. 4, the preferred embodiment according to the present invention, which is based upon the aforementioned theories, includes the following computer-implemented steps performed by a power analyzer 1 that is shown in FIG. 5 to include an analog/digital converter 11, a processor 12 coupled to the analog/digital converter 11, and a display unit 13 coupled to the processor 12.

The first step is to sample a continuous time domain signal via the analog/digital converter 11 of the power analyzer 1 to obtain a sampling signal x(n) according to a predetermined sampling frequency R, a predetermined duration of sampling T, and a predetermined number N of sample points. In this step, the predetermined duration of sampling T must be appropriate for clearly distinguishing components of a frequency spectrum of every frequency band. The predetermined sampling frequency R must be appropriate for avoiding an aliasing effect. Preferably, the analog/digital converter 11 includes a voltage converting circuit 111, and an analog/digital converting circuit 112 coupled to the voltage converting circuit 111 and the processor 12. The voltage converting circuit 111 is used for suitable buck conversion of a voltage of an AC signal (110V) so as to generate the continuous time domain signal which has an appropriate voltage conforming with an input voltage range (0~5V) of the analog/digital converting circuit 112. Subsequently, the analog/digital converting circuit 112 samples the time domain signal generated by the voltage converting circuit 111 to obtain the sampling signal x(n).

In the second step, two reference sampling signals x(n') are obtained via the processor 12 of the power analyzer 1 based upon the sampling signal x(n) obtained by the analog/digital converter 11 in the first step.

One of the reference sampling signals x(n') is obtained using a higher sampling frequency that is higher than the predetermined sampling frequency R, and the other one of the two reference sampling signals x(n') is obtained using a lower sampling frequency that is lower than the predetermined sampling frequency R. The reference sampling signals x(n') can be obtained through use of Equation 15, i.e., the 1 degree Lagrange's interpolation polynomial.

The third step is to transform the sampling signal obtained by the analog/digital converter 11 in the first step and the reference sampling signals obtained in the second step to frequency domain signals using Fast Fourier Transform (FFT) performed by the processor 12, respectively.

The fourth step is to compute a sum-of-amplitudes AS for each of the three frequency domain signals obtained in the third step based upon the following equation performed by the processor 12, $$AS = \sum_{m=0}^{N-1} A(m). \tag{16}$$

The fifth step is to estimate a minimum sum-of-amplitudes value AS* and a corresponding re-sampling frequency R*. Equations 11 to 14 are performed by the processor 12 to estimate the minimum sum-of-amplitudes value AS* and the corresponding re-sampling frequency R*, wherein $AS_1$, $AS_2$ and $AS_3$, and $R_1$, $R_2$ and $R_3$ are the sums-of-amplitudes computed in the fourth step and the corresponding sampling frequencies. A smaller one of AS* computed by Equations 12 and 14 is the minimum sum-of-amplitudes value, and a corresponding frequency R* computed by Equation 11 or 13 is the re-sampling frequency.

The sixth step is to obtain a new reference sampling signal x(n') via the processor 12. The new reference sampling signal is obtained based upon the sampling signal x(n) obtained by the analog/digital converter 11 in the first step and the re-sampling frequency R using Equation 15.

The seventh step is to transform the new reference sampling signal obtained in the sixth step to a frequency domain signal using FFT performed by the processor 12.

The eighth step is to compute a sum-of-amplitudes for the frequency domain signal obtained in the seventh step using Equation 16 performed by the processor 12.

The ninth step is to re-estimate the minimum sum-of-amplitudes value AS* and the corresponding re-sampling frequency R* using Equations 11 to 14 performed by the processor 12. In this step, the sum-of-amplitudes AS computed in the eighth step is used to replace one of the three sums-of-amplitudes $AS_1$, $AS_2$ and $AS_3$ that was used to estimate the previous minimum sum-of-amplitudes value and that has a largest variance with the sum-of-amplitudes obtained in the eighth step, and the re-sampling frequency R used in the sixth step is used to replace one of the three sampling frequencies $R_1$, $R_2$ and $R_3$ that was used to estimate the previous minimum sum-of-amplitudes value and that corresponds to said one of the three sums-of-amplitudes with the largest variance.

The sixth to ninth steps are repeated until respective changes in the re-estimated minimum sum-of-amplitudes value AS* and the corresponding re-sampling frequency R* conform with a predetermined convergence standard. The re-sampling frequency R* that conforms with the predetermined convergence standard is the optimum sampling frequency. Preferably, the display unit 13 is controlled by the processor 12 for outputting an optimum frequency spectrum based upon the optimum sampling frequency obtained by the processor 12.

In practice, the processor 12 of the power analyzer 1 can be TMS320LF2407 manufactured by Texas Instruments®.

The following example is provided to evaluate the analytic ability of this embodiment according to the present invention. In the following disclosure, a first section discusses the result of re-sampling, a second section discusses convergence, and a third section compares the method of this embodiment with a conventional method.

(I) Re-Sampling:

For illustrating the relatively accurate result of re-sampling in this embodiment of the present invention, a standard sampling signal obtained by sampling a power signal is proposed as an example in this section. First five harmonics of a current in a three-phase six-pulse commutator can be represented by $$x(t) = \tag{17}$$
$$4.6587\cos(2\pi \cdot 59.9t - 2.0065) + 0.8912\cos(2\pi \cdot 2.99.5t - 0.8585) +$$
$$0.2902\cos(2\pi \cdot 419.3t - 0.8455) +$$
$$0.1101\cos(2\pi \cdot 658.9t - 1.1601) + 0.0761\cos(2\pi \cdot 778.7t - 1.1192).$$

Figure 6:
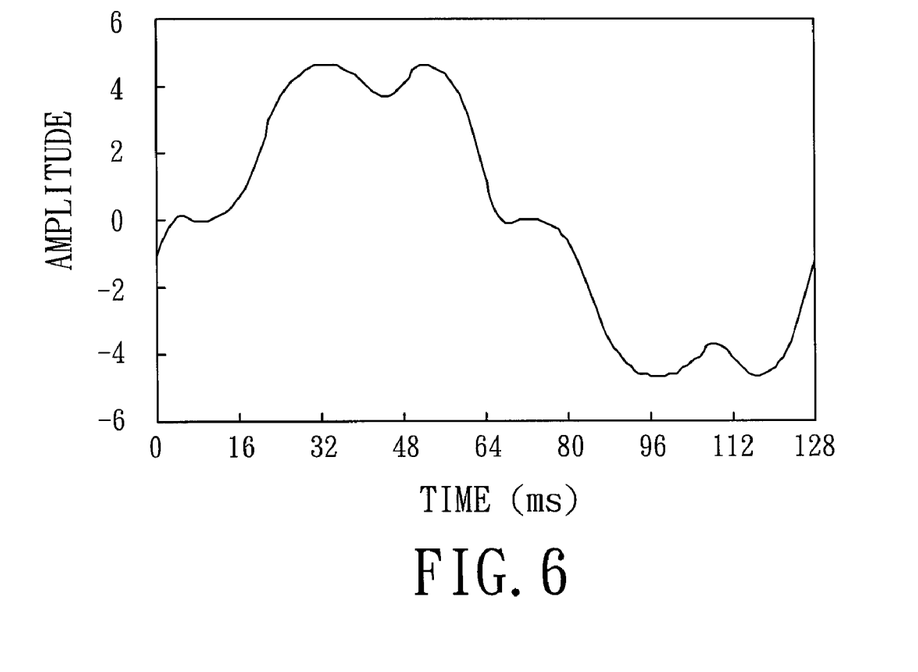
FIG. 6 is a plot showing an exemplary sampling signal to illustrate the preferred embodiment according to the present invention.
Figure 7:
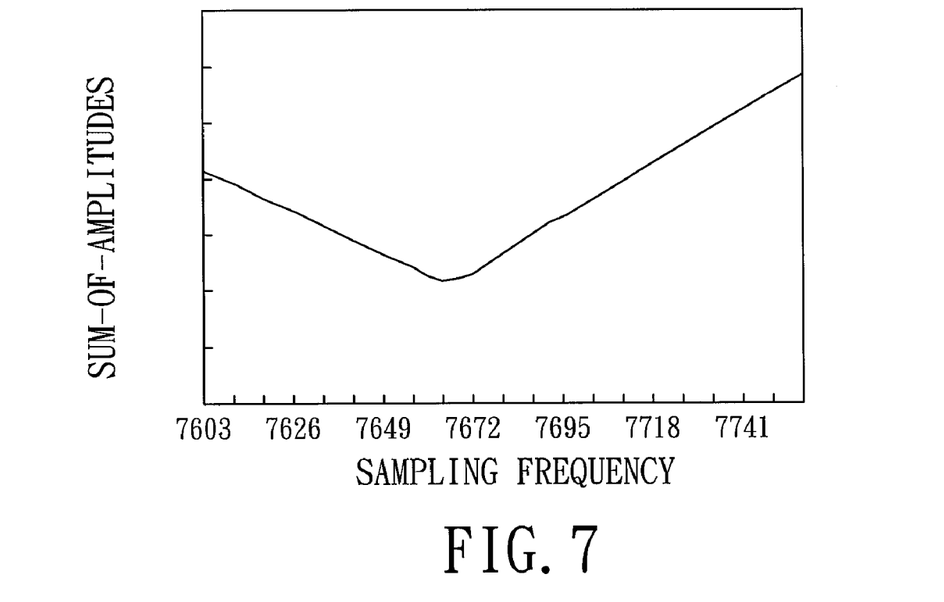
FIG. 7 is another plot to illustrate the preferred embodiment according to the present invention.

The predetermined number N of sample points is 128, and the predetermined sampling frequency R is 7680 (data/sec). A waveform of this signal is shown in FIG. 6. It is noted that this waveform includes many zero-crossing points. General devices utilize the zero-crossing points as a reference to compute signal period. However, once the signal is too complex or is disturbed by noise, a zero-crossing-point method that utilizes the zero-crossing points for computing signal period will have errors. The method of this embodiment effectively avoids this disadvantage of the zero-crossing-point method. Re-sampling the original power signal according to different sampling frequencies can obtain different frequency spectrums corresponding to the different sampling frequencies. As shown in Table 1, it is noted that using the different sampling frequencies will result in different results for the frequency spectrums. Components of the second and third harmonics should be zero. However, there are errors at graduations corresponding to the components that should be zero due to the leakage effect. It is noted from Table 1 that there is a relatively better analysis result when the sampling frequency is 7664.64 (data/sec). As shown in FIG. 7, a minimum value of the sum-of-amplitudes AS occurs when the sampling frequency R is 7664.64 (data/sec).

TABLE 1

Values read from frequency spectrums generated with different sampling frequencies

| | Sampling Frequency | | | | |
|---|---|---|---|---|---|
| | 7603.2 | 7664.64 | 7680 | 7718.4 | 7756.8 |
| Fundamental Frequency | 4.641 | 4.657 | 4.661 | 4.666 | 4.671 |
| $2^{nd}$ Harmonic | 0.050 | 0.002 | 0.009 | 0.034 | 0.057 |
| $3^{rd}$ Harmonic | 0.029 | 0.002 | 0.005 | 0.015 | 0.023 |
| $4^{th}$ Harmonic | 0.036 | 0.002 | 0.006 | 0.022 | 0.038 |
| $5^{th}$ Harmonic | 0.884 | 0.888 | 0.892 | 0.889 | 0.891 |
| $6^{th}$ Harmonic | 0.031 | 0.001 | 0.006 | 0.025 | 0.042 |
| $7^{th}$ Harmonic | 0.263 | 0.288 | 0.295 | 0.308 | 0.324 |
| $8^{th}$ Harmonic | 0.034 | 0.001 | 0.007 | 0.029 | 0.050 |
| $9^{th}$ Harmonic | 0.020 | 0.000 | 0.004 | 0.018 | 0.031 |
| $10^{th}$ Harmonic | 0.009 | 0.005 | 0.002 | 0.009 | 0.016 |
| $11^{th}$ Harmonic | 0.092 | 0.108 | 0.113 | 0.119 | 0.126 |
| $12^{th}$ Harmonic | 0.018 | 0.000 | 0.004 | 0.015 | 0.025 |
| $13^{th}$ Harmonic | 0.053 | 0.074 | 0.080 | 0.089 | 0.098 |
| AS | 13.070 | 12.075 | 12.333 | 13.138 | 13.927 |

(II) Convergence:

It is assumed that the sampling frequencies 7603.2, 7680 and 7756.8 are used as reference for estimating the minimum sum-of-amplitudes value AS and re-sampling frequency R to determine the optimum sampling frequency. Results of iterations according to the preferred embodiment are shown in Table 2. It is note from Table 2 that the estimated optimum sampling frequency is fairly accurate after iterating once. Because the relationship between the sum-of-amplitudes AS and the sampling frequency R exhibits the V-curve as shown in FIG. 7, the optimum sampling frequency 7664.28 and the corresponding minimum sum-of-amplitudes value 12.080 can be obtained by iteration in the method of this embodiment. A range of the reference sampling frequencies must cover the optimum sampling frequency when using the method of this embodiment. For example, the reference sampling frequencies could be 59.5 Hz, 60 Hz and 60.5 Hz for determining the optimum sampling frequency for an electric power system with a marked frequency of 60 Hz.

TABLE 2

Iteration results

| Iteration | $R_1$ | $R_2$ | $R_3$ | R* | AS* |
|---|---|---|---|---|---|
| $1^{st}$ | 7603.2 | 7680 | 7756.8 | 7659.355 | 12.333 |
| $2^{nd}$ | 7603.2 | 7659.355 | 7680 | 7664.280 | 12.157 |
| $3^{rd}$ | 7659.355 | 7664.280 | 7680 | 7664.206 | 12.080 |
| $4^{th}$ | 7659.355 | 7664.206 | 7664.280 | 7664.279 | 12.082 |
| $5^{th}$ | 7664.206 | 7664.279 | 7664.280 | 7664.280 | 12.080 |
| $6^{th}$ | 7664.279 | 7664.280 | 7664.280 | 7664.280 | 12.080 |

(III) Comparsion:

Table 3 shows a comparison between the method of this embodiment and the conventional method using FFT. From Table 3, it is noted that there are errors in frequencies, amplitudes and phases of frequency spectrums obtained using FFT for transformation of a time domain signal to a frequency domain signal. Comparatively, the frequency spectrum obtained using the method of this embodiment is relatively accurate. In an analytical process of the method of this embodiment, it takes a fairly short amount of time to transform the time domain signal to the frequency domain signal by using FFT and to estimate the minimum sum-of-amplitudes value and the re-sampling frequency. Therefore, the method of this embodiment can be used for real-time analysis.

TABLE 3

Comparison between this invention and FFT

| Harmonics | Parameter | Actual Value | FFT | This Invention |
|---|---|---|---|---|
| Fundamental Frequency | Frequency | 59.9 | 60/0.17 | 59.877/0.04 |
| | Amplitude | 4.659 | 4.661/0.04 | 4.657/0.04 |
| | Phase | −2.007 | −2.012/0.16 | −2.005/0.06 |
| $5^{th}$ Harmonic | Frequency | 299.5 | 300/0.17 | 299.386/0.04 |
| | Amplitude | 0.891 | 0.892/0.11 | 0.888/0.33 |
| | Phase | −0.859 | −0.887/0.89 | −0.851/0.25 |
| $7^{th}$ Harmonic | Frequency | 419.3 | 420/0.17 | 419.140/0.04 |
| | Amplitude | 0.290 | 0.295/1.72 | 0.287/1.03 |
| | Phase | −0.846 | −0.887/1.3 | −0.837/0.29 |
| $11^{th}$ Harmonic | Frequency | 658.9 | 660/0.17 | 658.649/0.04 |
| | Amplitude | 0.110 | 0.113/2.73 | 0.108/1.82 |
| | Phase | −1.160 | −1.162/0.06 | −1.094/2.1 |
| $13^{th}$ Harmonic | Frequency | 778.7 | 780/0.17 | 778.403/0.04 |
| | Amplitude | 0.076 | 0.080/5.26 | 0.074/2.63 |
| | Phase | −1.119 | −1.183/2.04 | −1.111/0.25 |

Note:
Columns of "FFT" and "This invention" are in terms of: obtained value/percentage of error.

As described hereinbefore, in this embodiment, the method performed by the power analyzer enhances the accuracy of the frequency spectrum compared with the conventional FFT method. Since the accuracy of the frequency spectrum will be affected by the sampling frequency, the method of this embodiment provides Equation 16 for computing the sum-of-amplitudes for estimating the optimum sampling frequency pertinent to the V-curve. Because the relationship between the sum-of-amplitudes and the sampling frequency tends to exhibit the V-curve, the optimum sampling frequency can be acquired via the V-curve. Once the optimum sampling frequency is acquired, the optimum frequency spectrum can be obtained. The method of this embodiment for determining an optimum sampling frequency is adapted for application to various power analyzers, such as a spectrum analyzer, a harmonic analyzer, a distortion analyzer, and digital harmonic measuring equipments.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

What is claimed is:

1. A power analyzer adapted for determining an optimum sampling frequency comprising:
    an analog/digital converter adapted for sampling a continuous time domain signal to obtain a digital sampling signal according to a predetermined sampling frequency and a predetermined number of sample points;
    a processor coupled to said analog/digital converter, and adapted for performing the following steps
    a) obtaining two reference sampling signals based upon the digital sampling signal obtained by said analog/digital converter, wherein one of the reference sampling signals is obtained using a higher sampling frequency that is higher than the predetermined sampling frequency used by said analog/digital converter, and the other one of the two reference sampling signals is obtained using a lower sampling frequency that is lower than the predetermined sampling frequency used by said analog/digital converter, b) transforming the digital sampling signal obtained by said analog/digital converter and the reference sampling signals obtained in step a) to frequency domain signals using Fast Fourier Transform, respectively, c) computing a sum-of-amplitudes for each of the three frequency domain signals obtained in step b), d) estimating a minimum sum-of-amplitudes value and a corresponding re-sampling frequency based upon the three sums-of-amplitudes computed in step c) and the corresponding sampling frequencies used by said analog/digital converter and in step a), e) obtaining a new reference sampling signal based upon the sampling signal obtained by said analog/digital converter using the re-sampling frequency, f) transforming the new reference sampling signal obtained in step e) to a frequency domain signal using Fast Fourier Transform, g) computing a sum-of-amplitudes for the frequency domain signal obtained in step f), h) re-estimating the minimum sum-of-amplitudes value and the corresponding re-sampling frequency with the sum-of-amplitudes obtained in step g) being used to replace one of the three sums-of-amplitudes that was used to estimate the previous minimum sum-of-amplitudes value and that has a largest variance with the sum-of-amplitudes obtained in step g), and with the re-sampling frequency used in step e) being used to replace one of the three sampling frequencies that was used to estimate the previous minimum sum-of-amplitudes value and that corresponds to said one of the three sums-of-amplitudes with the largest variance, and i) repeating steps e) to h) until respective changes in the re-estimated minimum sum-of-amplitudes value and the corresponding re-sampling frequency conform with a predetermined convergence standard, wherein the re-sampling frequency that conforms with the predetermined convergence standard is the optimum sampling frequency; and a display unit coupled to and controlled by said processor, and adapted for outputting an optimum frequency spectrum based upon the optimum sampling frequency obtained by said processor.

2. The power analyzer as claimed in claim 1, wherein said analog/digital converter is configured to sample the continuous time domain signal according to the predetermined number 2n of sample points, n being a positive integer.

3. The power analyzer as claimed in claim 1, wherein said processor is configured to obtain the reference sampling signals in steps a) and e) using Lagrange's interpolation method.

4. The power analyzer as claimed in claim 1, wherein said processor is configured to compute the sum-of-amplitudes in each of steps c) and g) based upon the equation $$AS = \sum_{m=0}^{N-1} A(m),$$

wherein N is the number of sample points in step a), and $A(m)$ is an amplitude corresponding to a $m^{th}$ component of the frequency domain signal.

5. The power analyzer as claimed in claim 1, wherein said processor is configured to estimate the minimum sum-of-amplitudes value and the corresponding re-sampling frequency in steps d) and h) based upon two equation sets $$R^* = \frac{R_2 + R_1}{2} + \frac{(R_2 - R_3)(AS_1 - AS_2)}{2(AS_2 - AS_3)}$$

$$AS^* = \frac{AS_2 + AS_1}{2} + \frac{(AS_2 - AS_3)(R_1 - R_2)}{2(R_2 - R_3)},$$

and $$R^* = \frac{R_2 + R_3}{2} + \frac{(R_2 - R_1)(AS_3 - AS_2)}{2(AS_2 - AS_1)}$$

$$AS^* = \frac{AS_2 + AS_3}{2} + \frac{(AS_2 - AS_1)(R_3 - R_2)}{2(R_2 - R_1)},$$

wherein $R_1$, $R_2$ and $R_3$ are the sampling frequencies, and $AS_1$, $AS_2$ and $AS_3$ are the sums-of-amplitudes of the frequency domain signals, the minimum sum-of-amplitudes value being a smaller one of the AS* estimated using the two equation sets.

6. The power analyzer as claimed in claim 5, wherein said processor is configured to compute the sums-of-amplitudes $AS_1$, $AS_2$ and $AS_3$ in steps c) and g) based upon the equation $$AS_i = \sum_{m=0}^{N-1} A_i(m), \ i = 1, 2 \text{ and } 3,$$

wherein N is the number of sample points in step a), and $A_i(m)$ is an amplitude corresponding to a $m^{th}$ component of the corresponding one of the frequency domain signals.

* * * * *